United States Patent [19]
Nilsson

[11] Patent Number: 5,338,360
[45] Date of Patent: Aug. 16, 1994

[54] DEVICE FOR CIRCULATING AND APPLYING A VISCOUS MATERIAL IN PATCHES ON A SUBSTRATE

[75] Inventor: Kenth A. S. Nilsson, ÅAkersberga, Sweden

[73] Assignee: Qenico AB, Akersberga, Sweden

[21] Appl. No.: 956,872

[22] PCT Filed: Feb. 27, 1991

[86] PCT No.: PCT/SE91/00155
§ 371 Date: Sep. 2, 1992
§ 102(e) Date: Sep. 2, 1992

[87] PCT Pub. No.: WO91/12921
PCT Pub. Date: Sep. 5, 1991

[30] Foreign Application Priority Data
Mar. 2, 1990 [SE] Sweden ............... 90 00749-3

[51] Int. Cl.⁵ .................. B05B 1/08; B05C 5/00
[52] U.S. Cl. ................... 118/602; 118/300; 239/102.2
[58] Field of Search ............. 118/300, 602; 239/102.1, 102.2; 222/420, 424; 366/136, 195

[56] References Cited
U.S. PATENT DOCUMENTS
4,667,877 5/1987 Yao et al. ............... 239/102.2
4,828,886 5/1989 Hieber .

FOREIGN PATENT DOCUMENTS
89-04728 6/1989 PCT Int'l Appl. .
90-00852 1/1990 PCT Int'l Appl. .

*Primary Examiner*—Michael W. Ball
*Assistant Examiner*—Richard Crispino
*Attorney, Agent, or Firm*—Keck, Mahin & Cate

[57] ABSTRACT

A device for applying a solder paste, a glue or another similar material in patches on a substrate includes a supply of material, an outlet, connected to the supply by a conveying conduit, and an arrangement for intermittently forcedly discharging the material in successive small quantities through the outlet. In order to counteract any sedimentation within the conveying conduit, the conduit is formed as a closed loop which contains a pump for feeding the material in a continuous circulating flow therethrough and past the outlet. The outlet includes a discharge opening, provided in the wall of the conveying conduit and through which the material may be thrown out in small quantities by the aid of the arrangement for intermittently forcedly discharging the material, which transiently increases the pressure in the conveying conduit within a zone located adjacent to the discharge opening.

10 Claims, 3 Drawing Sheets

DEVICE FOR CIRCULATING AND APPLYING A VISCOUS MATERIAL IN PATCHES ON A SUBSTRATE

BACKGROUND OF THE INVENTION

1. Field of the Invention

The present invention relates to a device for use in applying a liquid material consisting of a solder paste, a glue or another viscous liquid or liquid dispersion in discrete small quantities to selected points on a substrate, for instance an electric circuit board.

More particularly, the invention relates to such a device of the kind comprising a supply of said material, an outlet, connected to said supply by means of a conveying conduit, and means for intermittently forcedly discharging the material in successive small quantities through the outlet and applying each such quantity to a selected point on a substrate, placed in front of the outlet and movable in relation thereto.

2. Description of Related Art

Devices of the above kind are previously known which, similar to the device according to the invention, are primarily intended to be used for applying a solder paste or an electrically conductive glue on electric circuit boards before placing components intended to be surface mounted thereon, but which, similar to the device according to the invention, may be used also for applying other viscous liquids or liquid dispersions on any suitable kind of substrate.

A troublesome disadvantage of these known devices has been found to be that, both during the use of the devices as well as, and above all, during interruptions in their use, a sedimentation may easily occur in the conveying conduit extending between the supply and the outlet. This sedimentation may result in that the material discharged through the outlet will have quite another composition than intended. Moreover, the sedimentation in the conveying conduit may also cause heavy cloggings in said conduit, especially in the case of extended breaks in the use of the devices.

SUMMARY OF THE INVENTION

The invention has for its purpose to provide a new and improved device of the kind initially specified which avoids the above disadvantages of the known devices in a favourable manner.

The device, according to the invention proposed for the above purpose, is primarily characterized in that the conveying conduit is formed as a closed loop which contains means for feeding the material in a circulating flow therethrough and past the outlet which comprises a discharge opening, provided in the wall of the conveying conduit and through which the material may be discharged in successive small quantities by the aid of means for intermittently transiently increasing the internal pressure in the conveying conduit within a zone thereof, located in the vicinity of the discharge opening.

By forming the conveying conduit in the above manner, it is possible, in an easy manner, effectively to eliminate the risk of a sedimentation of the material within the conveying conduit, existing in the known devices. Thus, the invention makes it possible to ensure that the material discharged through the outlet will have the desired composition and that any clogging will not occur in the conveying conduit, even after longer breaks in the discharge of material through the outlet.

The continuous circulation of the material in a closed loop within the conveying conduit also causes a certain homogenization of the material. In order to intensify this homogenization, the means serving to feed the material through the conveying conduit may advantageously be arranged to subject the material to a homogenizing mechanical treatment when it passes said means. For this purpose, the feeding means may preferably be formed by a screw pump or a gear pump.

In order to counteract any tendency of the material to adhere to the conveying conduit, this conduit may suitably be provided with an internal liquid repellent coating which for instance may consist of polytetrafluoroethylene. Alternatively, the entire conveying conduit may consist of a liquid repellent material.

Moreover, in order to make it possible to place the substrate at a longer distance from the outlet than otherwise possible, the outlet may lead into an ejector nozzle by which the material discharged through the outlet may be brought to move at an increased speed towards the substrate.

Said means for intermittently transiently increasing the internal pressure in the conveying conduit within a zone thereof located in the vicinity of the discharge opening, may suitably comprise means for providing an intermittent transient resilient compression of a portion of the conveying conduit located adjacent to said opening.

These compressing means may preferably comprise an electrically operated impact force generating arrangement which is adapted intermittently to apply an impact force on said portion of the conveying conduit at a location in the vicinity of the discharge opening. This impact force generating arrangement may advantageously be of a magnetostrictive or piezoelectric type.

BRIEF DESCRIPTION OF THE DRAWINGS

Below, the invention is further described with reference to the accompanying diagrammatic drawings, in which.

DESCRIPTION OF THE PREFERRED EMBODIMENTS

Figure 1:
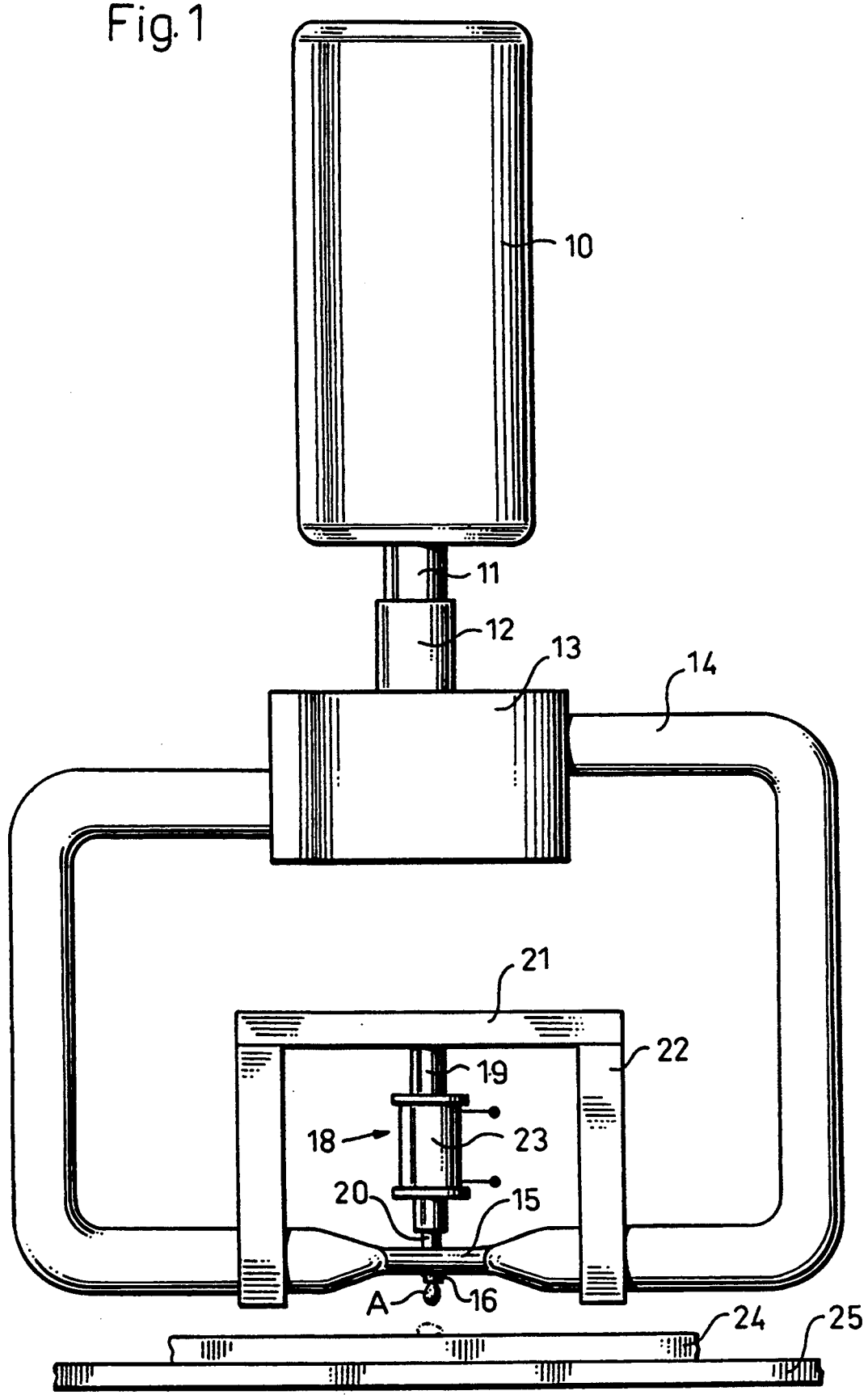
FIG. 1 shows a front view of a device according to a first embodiment of the invention, selected by way of example.
Figure 2:
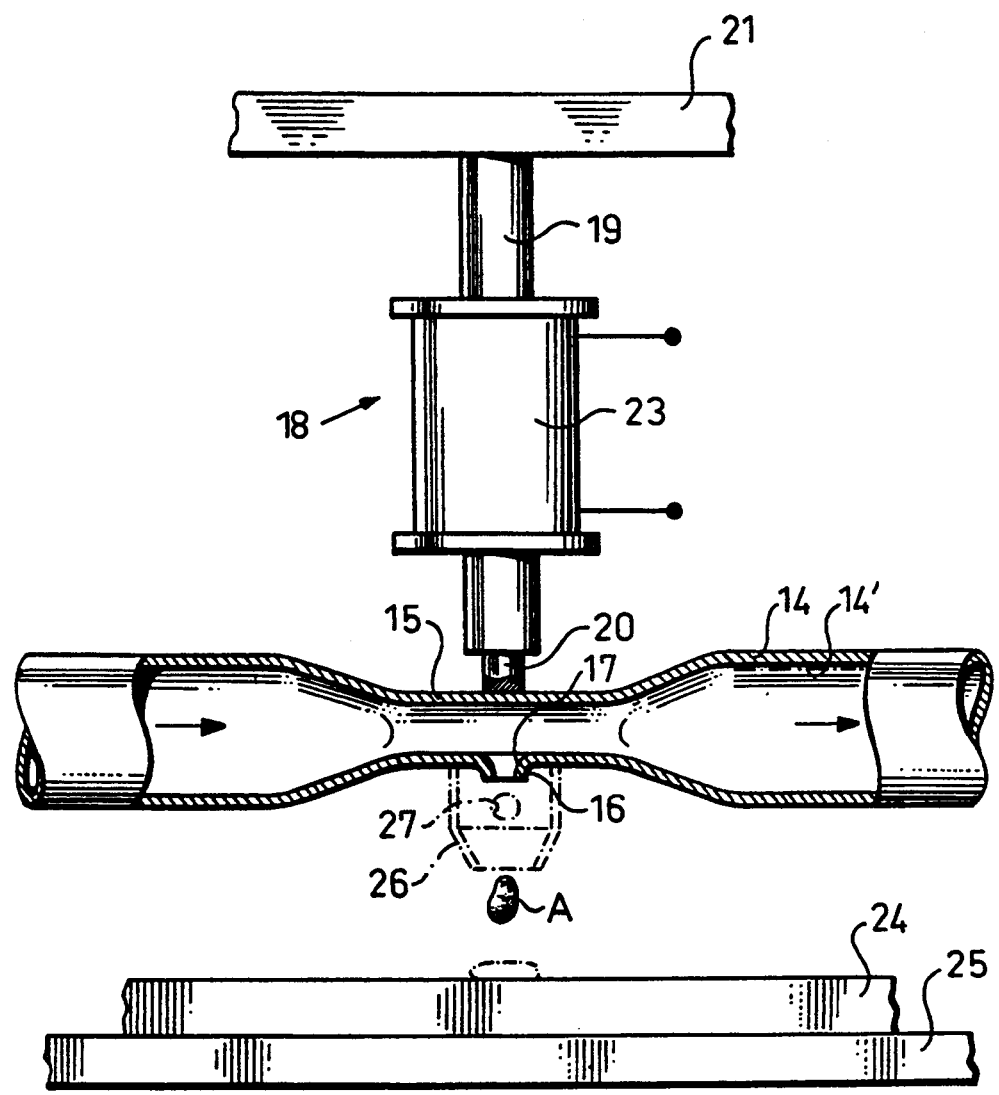
FIG. 2 shows a partial view, on an enlarged scale and in section, of said device.

The device shown in FIGS. 1 and 2 comprises a supply container 10 which contains a material consisting of a viscous liquid or a liquid dispersion. At its lower end, container 10 is provided with a neck portion 11 by means of which it is removably mounted in an inlet pipe connection 12 of a pump 13 to permit a delivery of said material into said pump. Pump 13 is connected in a conveying conduit 14 for the material delivered into pump 13 from container 10, formed as a closed loop. Said material may hereby be fed in a continuous circulating flow through conveying conduit 14 by means of pump 13.

Pump 13 may preferably consist of a screw pump, a gear pump or any other suitable pump which will subject the material fed through conveying conduit 14 to a homogenizing mechanical treatment when it passes through the pump. Furthermore, conveying conduit 14 may preferably be provided with an internal liquid repellent coating 14' (FIG. 2) which counteracts any tendency of said material to adhere to the conveying conduit and which for instance may consist of polytetrafluoroethylene.

Conveying conduit 14 consists of a metal pipe of circular cross section which has been bent to a loop shape shown in FIG. 1 and the central lower part of which is provided with a flattened portion 15 having at least approximately flat upper and lower sides. In the centre of the lower side of portion 15 there is provided a discharge opening 17 leading into an outlet 16 which projects in a downward direction from said side.

Reference numeral 18 generally designates an arrangement for intermittently applying impact forces on the upper side of portion 15 of conveying conduit 14 at a central section thereof, located opposite to discharge opening 17 and outlet 16. The active impact force generating member of said arrangement consists of a rod 19 of a magnetostrictive material, e.g. Terfenol-d, which rests against the upper flat side of portion 15 of conduit 14 with a lower end portion 20 of reduced diameter, while, at its upper end, it is provided in contact with a stationary seat 21, located above rod 19 and serving to prevent said rod from moving in an upward direction. In FIG. 1, seat 21 has been shown to consist of a horizontal plate which, at two opposite ends thereof, is rigidly mounted on two vertical support plates 22, firmly secured to conveying conduit 14.

In addition to rod 19, arrangement 18 also comprises a winding 23, mounted on said rod. When an electric current is fed through said windning 23, it will generate a magnetic flux through rod 19, causing an elongation of said rod. Hereby, rod 19 will apply an impact force on the upper side of portion 15 of conduit 14 each time a current pulse is fed through winding 23. The magnitude of this force varies in response to the amplitude of the current pulse. Provided that the current pulse has sufficient amplitude, the impact force applied on the upper side of portion 15 will have sufficient influence on the pressure of the material contained in conduit portion 15 behind discharge opening 17 and outlet 16 to cause a forced discharge of a small quantity A of said material through outlet 16. The quantity of material discharged through outlet 16 will be thrown against a substrate 24, placed in front of outlet 16 and supported at a short distance from outlet 16 on a supporting member 25. In order to permit the discharged material quantity A to be applied to a selected point on substrate 24, supporting member 25 may suitably be movable in relation to outlet 16 in mutually perpendicular horizontal directions.

In order to impart an increased speed in direction towards substrate 24 to the material quantity A discharged through outlet 16, an ejector nozzle 26, which has been shown in dash-dotted lines in FIG. 2 and into which outlet 16 leads, may be secured to the lower side of portion 15 of conduit 14. Ejector nozzle 26 is provided with a number of openings 27 through which compressed air may be fed into said nozzle to cause the desired ejector action.

As material is discharged from conveying conduit 14 through outlet 16, new material is supplied from container 10 to maintain a continuously circulating flow of material in the closed loop formed by conduit 14 and pump 13. Supply container 10 may suitably be mounted easily removable in inlet pipe connection 12 of pump 13 so that, when it has been emptied, it may easily be replaced by a fresh filled container.

Figure 3:
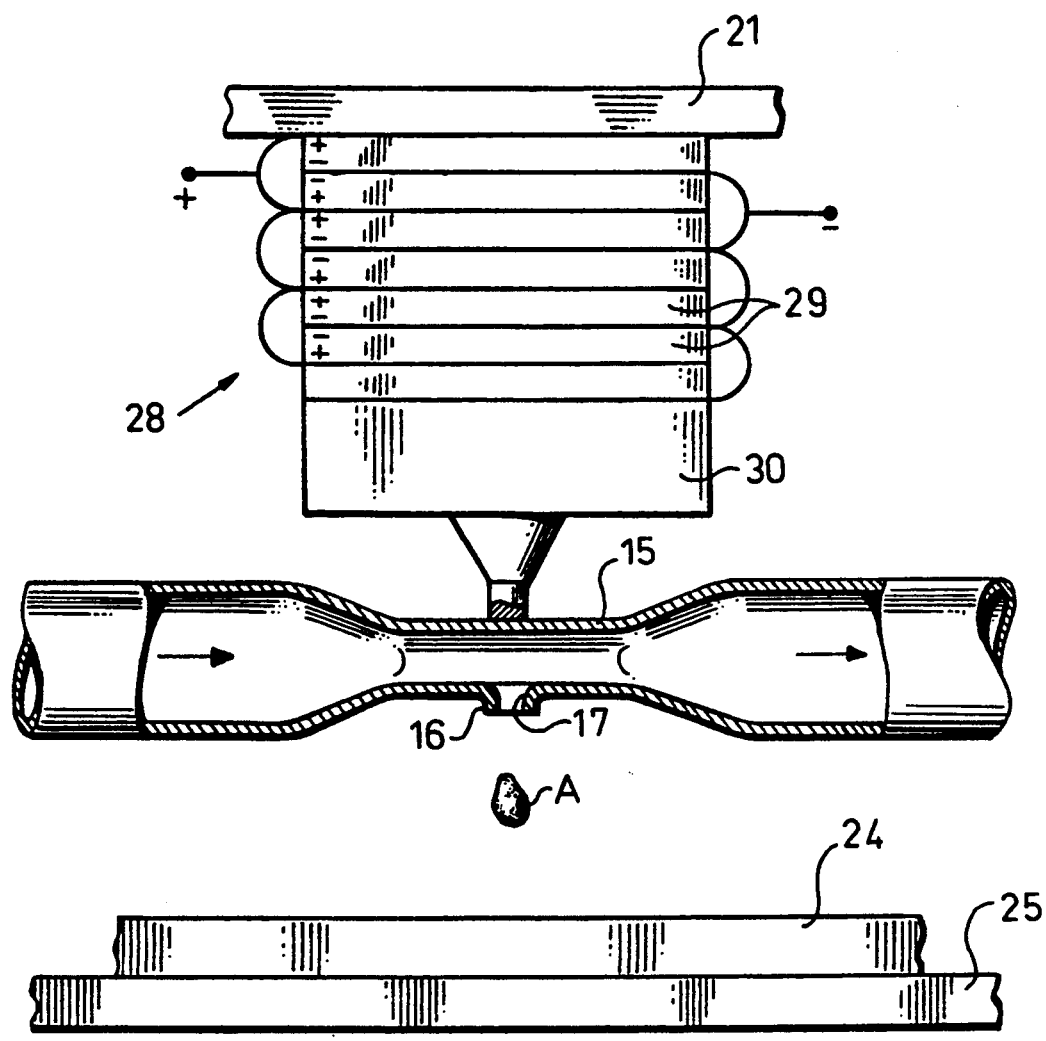
FIG. 3 shows a corresponding partial view of a device according to a second embodiment of the invention, also selected by way of example.

In the embodiment shown in FIG. 3, the impact force generating arrangement 18 of FIGS. 1 and 2 has been replaced by an arrangement 28, consisting of a stack of disks 29 of a piezoelectric material which are covered by metal layers on their flat sides. Disks 29 are oriented in mutually opposite directions in an alternating manner and are connected electrically in parallel. The stack formed by disks 29 has its upper end provided in contact with seat 21, while, at its lower end, it rests against the upper side of portion 15 of conveying conduit 14 through the intermediary of a pressure head 30. When an electric voltage pulse is applied across piezoelectric disks 29, these disks will be subjected to an electric field causing a transient increase in their thickness whereby pressure head 30 will apply an impact force on the upper side of portion 15.

The devices above described are primarily intended to be used for applying a solder paste or an electrically conductive glue on electric circuit boards. However, they may also be used for many other purposes.

The invention is not restricted to the embodiments above described and shown in the drawings. Instead, many other embodiments are feasible within the scope of the invention. By way of example, it could be mentioned that the supply container may be replaced by a material supply integrated in any suitable manner in the closed loop formed by conduit 14 and pump 13. Moreover, the described impact force generating arrangements 18 and 28, respectively, may be replaced by other means for providing an intermittent discharge of material in successive small quantities through outlet 16.

I claim:

1. A device for use in applying a viscous liquid material in discrete small quantities to selected points on a substrate, said device comprising:
    a source of said material,
    an outlet connected to said source by a conveying conduit, the conveying conduit being formed as a closed loop,
    feeding means, contained in the closed loop, for feeding the material in a circulating flow therethrough and past the outlet, said outlet including a discharge opening provided in a wall of the conveying conduit, and
    means for intermittently and transiently increasing internal pressure in the conveying conduit within a zone thereof located near the discharge opening to intermittently forcedly discharge the material in successive small quantities through the outlet and apply each such quantity to a selected point on said substrate, which is placed in front of said outlet and movably supported in relation thereto.

2. A device according to claim 1, wherein the feeding means are arranged so as to subject the material to a homogenizing mechanical treatment when it passes said feeding means.

3. A device according to claim 2, wherein the feeding means are formed by at least one of a screw pump and a gear pump.

4. A device according to claim 1, wherein the conveying conduit (14) is provided with an internal liquid repellent coating.

5. A device according to claim 1, wherein the entire conveying conduit (14) consists entirely of a liquid repellent material.

6. A device according to claim 1, and further comprising an ejector nozzle, into which the outlet leads, by which the material discharged through the outlet may be brought at an increased speed towards the substrate.

7. A device according to claim 1, wherein said means for intermittently and transiently increasing the internal pressure in the conveying conduit within a zone thereof located near the discharge opening provides an intermittent transient resilient compression of a portion of the conveying conduit located adjacent to said opening.

8. A device according to claim 7, wherein said means for intermittently and transiently increasing the internal pressure in the conveying conduit includes an electrically operated impact force generating arrangement which intermittently applies an impact force on said portion of the conveying conduit at a point located in the vicinity of the discharge opening.

9. A device according to claim 8, characterized in that the impact force generating arrangement is of a magnetostrictive type.

10. A device according to claim 8, characterized in that the impact force generating arrangement is of a piezoelectric type.

* * * * *